US008516418B2

(12) United States Patent
Singh et al.

(10) Patent No.: US 8,516,418 B2
(45) Date of Patent: Aug. 20, 2013

(54) APPLICATION OF A RELATIONAL DATABASE IN INTEGRATED CIRCUIT DESIGN

(75) Inventors: Gunjeet Singh, Fremont, CA (US); Aman U. Joshi, Los Altos Hills, CA (US)

(73) Assignee: Oracle America, Inc., Redwood City, CA (US)

( * ) Notice: Subject to any disclaimer, the term of this patent is extended or adjusted under 35 U.S.C. 154(b) by 1273 days.

(21) Appl. No.: 11/478,782

(22) Filed: Jun. 30, 2006

(65) Prior Publication Data

US 2008/0005713 A1    Jan. 3, 2008

(51) Int. Cl.
*G06F 17/50*    (2006.01)

(52) U.S. Cl.
CPC ........ *G06F 17/5009* (2013.01); *G06F 17/5004* (2013.01); *G06F 17/505* (2013.01); *G06F 17/5072* (2013.01); *G06F 17/5077* (2013.01); *G06F 17/5081* (2013.01)
USPC ............. 716/106; 716/112; 716/136; 716/52; 716/53; 716/54; 716/55; 703/16

(58) Field of Classification Search
CPC .............. G06F 17/5004; G06F 17/505; G06F 17/5072; G06F 17/5077; G06F 17/50815
USPC ................ 716/1, 11, 18, 2, 5, 106, 112, 136, 716/52, 53, 54, 55; 703/14, 16
See application file for complete search history.

(56) References Cited

U.S. PATENT DOCUMENTS

| | | | |
|---|---|---|---|
| 5,333,316 A * | 7/1994 | Champagne et al. .. | 707/999.008 |
| 5,539,903 A * | 7/1996 | Kaplan et al. ......................... | 1/1 |
| 6,026,228 A | 2/2000 | Imai et al. | |
| 6,526,561 B2 | 2/2003 | Yokoyama et al. | |
| 6,671,857 B1 * | 12/2003 | Takahashi et al. ............ | 716/102 |
| 6,742,165 B2 * | 5/2004 | Lev et al. ........................... | 716/1 |
| 6,851,094 B1 * | 2/2005 | Robertson et al. ............ | 716/129 |
| 6,961,918 B2 * | 11/2005 | Garner et al. .................... | 716/18 |

(Continued)

OTHER PUBLICATIONS

Dictionary definition of "Relational Database", http://dictionary.reference/browse/relational+database?s=t[Dec. 31, 2012 9:28:26 AM], 3 pages, based on origin of terms, 1970-1975.*

(Continued)

*Primary Examiner* — Phallaka Kik
(74) *Attorney, Agent, or Firm* — Robert C. Kowert; Meyertons, Hood, Kivlin, Kowert & Goetzel, P.C.

(57) ABSTRACT

A relational database may be integrated into an integrated circuit design and analysis environment as the persistent data store for data associated with the design. This design data may include two or more abstractions of the design, such as layout data models and timing data models, in some embodiments. Design data may be partitioned in the database and indexed according to various attributes. The use of a relational database may facilitate cross-probing of design data corresponding to different abstractions of the design. The relational database may be queried to produce design reports and to identify design errors or weaknesses. Reports may be graphical or tabular, and may be displayed, printed, stored, or posted for viewing. Proposed modifications to a design may be investigated by modifying data in the relational database, rather than in the actual design. Design reports may be re-generated and compared with corresponding reports for the un-modified design.

20 Claims, 13 Drawing Sheets

(56) References Cited

U.S. PATENT DOCUMENTS

| | | | |
|---|---|---|---|
| 6,965,899 B1* | 11/2005 | Subramaniam et al. | 1/1 |
| 7,080,085 B1* | 7/2006 | Choy et al. | 1/1 |
| 7,409,666 B2* | 8/2008 | Almeida et al. | 716/137 |
| 7,475,000 B2* | 1/2009 | Cook et al. | 703/14 |
| 7,480,650 B2* | 1/2009 | Miller | 707/999.003 |
| 7,627,553 B1* | 12/2009 | Borofsky et al. | 705/7.33 |
| 7,788,625 B1* | 8/2010 | Donlin et al. | 716/109 |
| 2002/0019730 A1* | 2/2002 | Garner et al. | 703/14 |
| 2003/0009727 A1* | 1/2003 | Takeyama et al. | 716/1 |
| 2003/0229482 A1* | 12/2003 | Cook et al. | 703/14 |
| 2004/0163070 A1* | 8/2004 | Teig et al. | 716/18 |
| 2004/0181769 A1* | 9/2004 | Kochpatcharin et al. | 716/19 |
| 2007/0055924 A1* | 3/2007 | Farr et al. | 715/505 |
| 2007/0136383 A1* | 6/2007 | Steinbach et al. | 707/200 |
| 2007/0266352 A1* | 11/2007 | Cheng et al. | 716/4 |
| 2009/0031261 A1* | 1/2009 | Smith et al. | 716/2 |
| 2011/0231804 A1* | 9/2011 | Liu et al. | 716/54 |

OTHER PUBLICATIONS

Hollaar, Lee, et al., "The Structure and Operation of a Relational Database System in a Cell-Oriented Integrated Circuit Design System," University of Utah, Jun. 1984.

\* cited by examiner

| stage_layout_data 350 | |
|---|---|
| db_id | number |
| layer_name | string(100) |
| purpose_name | string(100) |
| net_name | string(100) |
| x1 | number |
| y1 | number |
| x2 | number |
| y2 | number |

| stage_layout_inst 370 | |
|---|---|
| instance_id | number |
| inst_view_id | number |
| inst_name | string(100) |
| mirror_x | number |
| mirror_y | number |
| rotation | number |
| translation_x | number |
| translation_y | number |
| bbox_x1 | number |
| bbox_y1 | number |
| bbox_x2 | number |
| bbox_y2 | number |

*FIG. 3*

| stage_timing_data 730 | |
|---|---|
| batch_id | number |
| path_id | number |
| path_type | string(10) |
| path_name | string(100) |
| delta | number(38,2) |

| stage_timing_data_detail 750 | |
|---|---|
| FK batch_id | number |
| FK path_id | number |
| net_seq_no | number |
| net_name | string(200) |
| net_delay | number(38,2) |
| net_cap | number |
| timing_cell_name | string(100) |
| gate_delay | number(38,2) |
| timing_pin_name | string(100) |
| pin_slew | number |
| fanout | number |
| direction | number |

*FIG. 7*

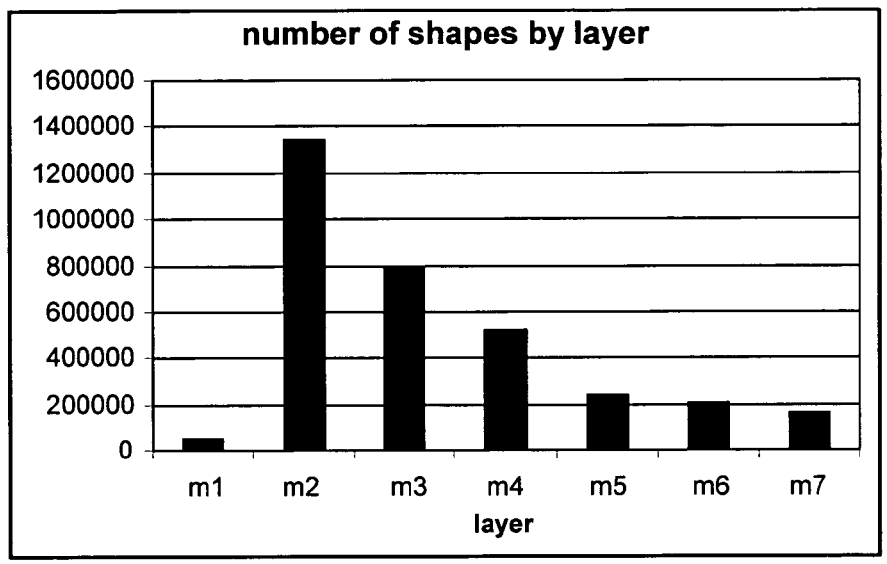
FIG. 11A
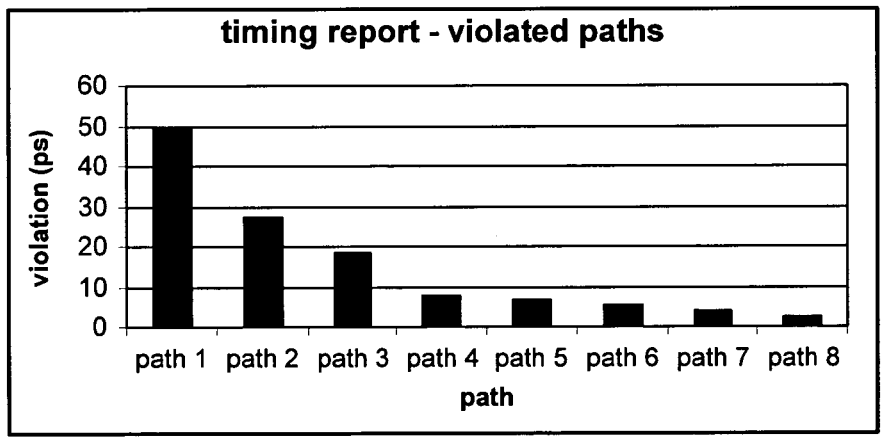
FIG. 11B
| net gate details | | | | |
|---|---|---|---|---|
| path name | net name | net delay | timing cell name | gate delay |
| path 1 | clock1 | 3.2 ps | clock_cell1 | 33.0 ps |
| path 1 | net1 | 12.3 ps | cell1 | 45.0 ps |
| path 1 | net2 | 39.4 ps | cell2 | 170.0 ps |
| path 1 | net3 | 4.2 ps | cell3 | 70.0 ps |
| path 1 | net4 | 11.7 ps | cell4 | 161.0 ps |
| path 1 | net5 | 5.1 ps | cell5 | 59.0 ps |
| path 1 | net6 | 3.0 ps | cell6 | 129.0 ps |
| path 1 | net7 | 2.6 ps | cell7 | 27.0 ps |
| path 1 | clock2 | 4.7 ps | clock_cell2 | 22.5 ps |
| path 1 | net8 | 1.2 ps | cell8 | 84.0 ps |
FIG. 11C

APPLICATION OF A RELATIONAL DATABASE IN INTEGRATED CIRCUIT DESIGN

BACKGROUND OF THE INVENTION

1. Field of the Invention

This invention relates to integrated circuit design and more specifically to storage, retrieval, and analysis of design data using a relational database.

2. Description of the Relevant Art

Design of an electronic circuit, for example, an integrated circuit (IC), is a complicated and time-consuming process. FIG. 1 illustrates a typical design flow of an integrated circuit device from conception through the generation of a fabrication ready design layout. Generally, the design flow commences with defining the design specifications or requirements, such as required functionality and timing, as indicated at 110. The requirements of the design are implemented, for example, as a net-list or electronic circuit description, as indicated at 120. The implementation can be performed by, for example, schematic capture (drawing the design with a computer aided design tool) or more typically, utilizing a high-level description language such as VHDL, Verilog and the like. The implemented design may be simulated to verify design accuracy, as indicated at 130. Design implementation and simulation may be iterative processes. For example, errors found by simulation may be corrected by design implementation and re-simulated.

Once the design is verified for accuracy through simulation, a design layout is created, as indicated at 140. The design layout may describe the detailed design geometries and the relative positioning of each design layer to be used in actual fabrication of the electronic circuit and is typically implemented as one or more design files encoding representations of the layers and geometries. The design layout is typically very tightly linked to overall circuit performance (area, speed and power dissipation) because the physical structure defined by the design layout determines, for example, the transconductances of the transistors, the parasitic capacitances and resistances of the circuit, and the silicon area used to realize a certain function. The detailed design layout may require a very intensive and time-consuming design effort and is typically performed utilizing specialized computer aided design (CAD) or Electronic Design Automation (EDA) tools.

Once the design layout is created, it is checked against a set of design rules in a design rule check (DRC) operation, as indicated at 150. The created design layout typically must conform to a complex set of design rules in order, for example, to ensure a lower probability of fabrication defects. The design rules specify, for example, how far apart various geometries on different layers must be, or how large or small various aspects of the layout must be for successful fabrication, given the tolerances and other limitations of the fabrication process. Design rules are typically closely associated with the technology, fabrication process and design characteristics. DRC may be a time-consuming, iterative process that often requires manual manipulation and interaction by the designer. The designer may perform design layout and DRC iteratively, reshaping and moving design geometries to correct all layout errors and achieve a DRC-clean (violation-free) design.

Circuit extraction is performed after the design layout is completed and error free, as illustrated at 160. The extracted circuit may identify individual transistors and interconnections, for example, on various layers, as well as the parasitic resistances and capacitances present between the layers. A layout versus schematic check (LVS) may be performed, as indicated at 170, in which the extracted net-list is compared to the design implementation created at 120. LVS may ensure that the design layout is a correct realization of the intended circuit topology. Any errors such as unintended connections between transistors, or missing connections/devices, etc., may be corrected in the design layout before proceeding to post-layout simulation, as indicated at 180. The post-layout simulation may be performed using the extracted net-list, which may provide an assessment of the circuit speed, the influence of circuit parasitics (such as parasitic capacitances and resistances), and any glitches that may occur due to signal delay mismatches. Once post-layout simulation is complete and errors found by LVS are corrected, the design may be ready for fabrication and may be sent to a fabrication facility.

EDA applications used for performing the various integrated circuit design tasks described above typically deal with very large volumes of data, some of which is geometric data. Traditionally all of this data is loaded into memory and processed when each EDA application is run. EDA applications may also produce large amounts of data, for example layout data and timing data. Processing and generating statistical reports on this data to identify trends in data distribution or other patterns that may indicate an error or weakness in the design can be memory-intensive and time-consuming when using a traditional approach.

SUMMARY

A relational database may be applied to the design and analysis of an integrated circuit, according to various embodiments. In various embodiments, an EDA application employing a centralized relational database may allow designers to work with persistent CAD data resident in the database, to share the data, to cross-link the data and to analyze the data. In some embodiments, such an application may allow users to verify and validate critical design parameters or to detect errors or weaknesses in the design early in the design cycle. For example, timing data stored in a relational database may be accessed and analyzed by a software application to identify the top ten timing violations in a given area of the design. In another example, layout data may be accessed and analyzed to identify the number of shapes on a given layer of the design layout.

A system for design and analysis of integrated circuits may in some embodiments include a three-tiered approach, with a user interface tier, a service or API middle tier, and a relational database as the persistent data store for design data. In some embodiments, the user interface may include a Java™ graphical user interface (GUI). In some embodiments, the underlying relational database may be an Oracle™ database. In some embodiments, the user interface may communicate with a Java™ based middle tier service that implements application and/or business logic and connects to a relational database, such as an Oracle™ database, through one or more JDBC (Java Database Connection) protocol drivers.

An integrated circuit design and analysis system and method thereof may allow various graphical and tabular reports to be generated from analysis of different types of CAD data used in integrated circuit design, in some embodiments. For example, layout data, timing data, noise data, clock flow data, power data, or test data may be stored in a relational database, as described herein, and may be accessed in order to perform a statistical analysis of the design, such for identifying timing violations or DRC violations. In various embodiments, generating reports from this analysis may include displaying the reports graphically or using any of various input/output devices, producing a printed report, or updating or adding one or more entries in a database, table, or other memory structure representing the output of the analysis.

The different types of design data stored in the relational database may be cross-referenced in order to identify the relationships between various representations or abstractions of the design, in some embodiments. For example, layout data may be cross-referenced with timing data so that if a timing violation is identified, a user may be able to pinpoint the problem area in the layout database and make corrections. In another example, if a DRC violation is detected, a user may be able to identify timing paths that may be affected by the structures involved in the violation or by changes made to correct the layout violation. In some embodiments, the system may allow incremental changes to the stored design data to support investigation of Engineering Change Order (ECO) scenarios. For example, if a timing violation is detected, the system may allow a user to view and edit the layout data stored in the database and corresponding to the timing path in question, and to rerun the timing report to see if the modification resulted in corrected timing for that path.

A relational database, such as an Oracle™ database, may include support for performing geometric or spatial operations on the data stored therein. In some embodiments, these operations may be applied to various tasks involved in the design and analysis of an integrated circuit design. For example, combinations of geometric operations (such as INTERSECTION or DIFFERENCE) may be applied to design layout data in order to determine overlap and spacing violations or to identify physical structures (such as transistors) represented by combinations of geometric shapes on various layers of the design. In some embodiments, a design and analysis system may include custom software code to perform geometric operations, while in others these functions may be supplied as part of a relational database or middle tier application software. In still other embodiments, a combination of built-in and custom software may provide such functions.

The system and method described herein may allow for concurrent access to the underlying relational database by multiple users, in some embodiments. In such embodiments, a user may be able query the database and generate reports concerning the design data irrespective of any queries or report generation being performed by other users at the same time. In some such embodiments, the system may be configured to allow modifications to be made by multiple users and for a change made by one user to propagate to other users accessing the database at the same time in order to reflect the modifications in real-time.

BRIEF DESCRIPTION OF THE DRAWINGS

FIG. 3 illustrates staging tables of a layout data model, according to one embodiment.

FIG. 7 illustrates staging tables of a timing data model, according to one embodiment.

FIGS. 11A-11C illustrate example reports generated from design data in a relational database, according to one embodiment.

Figure 1:
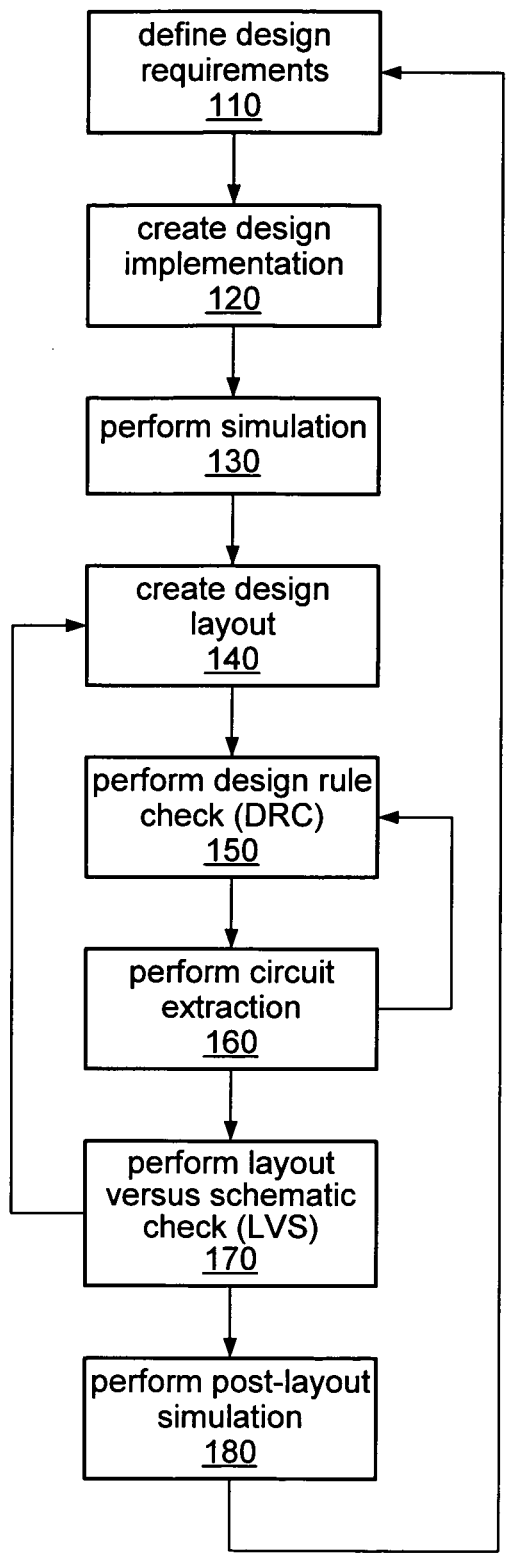
FIG. 1 illustrates an exemplary design flow for an integrated circuit device.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In a traditional integrated circuit design flow, it may be difficult to generate statistical reports on the large amounts of data produced and processed during design. In some embodiments, the use of a relational database as a persistent data store for design data may facilitate such report generation. For example, the use of a relational database may in some embodiments simplify and/or increase the speed of processing and generating statistical reports on design data. This may, in turn, allow designers to more easily and/or quickly identify trends in design data distribution or other patterns in design data that may indicate an error or weakness in the design than when using a traditional design data storage approach, in which large amounts of design data must be repeatedly loaded into memory for analysis.

Different types of data stored in a relational database may also be cross-probed as part of report generation or data analysis, in some embodiments. For example, layout and timing data may be stored in a relational database and associated with each other, such as by net names and/or placement information. In such embodiments, application software configured to perform data mining and analysis may access a portion of the layout and/or timing data stored in the relational database directly or through one or more Application Programming Interfaces (APIs) without having to load all of the data associated with the design into memory.

As previously noted, when different types of design data are associated with each other in the relational database, a designer may be able to quickly pinpoint and correct design errors or weaknesses, in some embodiments. For example, the system may be configured to display layout data for an area of the design in which a timing violation was detected and to highlight the violating path. In another example, the system may be configured to display a listing of the nets in a particular timing path, along with delay information for each net, and to display the corresponding layout data for that path, with these nets labeled or otherwise highlighted, alongside the timing information or in another window, according to various embodiments. In these examples, only the design data corresponding to the timing violations may be loaded for display, rather than the entire design database.

Figure 2:
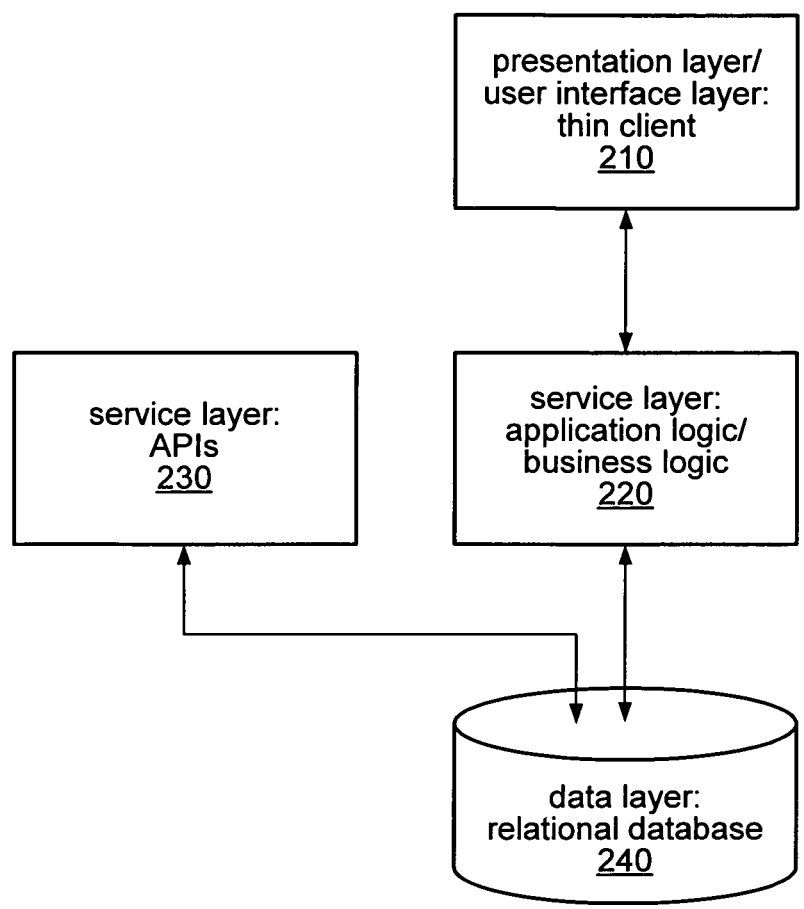
FIG. 2 illustrates a three-tiered architecture for design data storage and analysis, according to one embodiment.

A system employing a relational database as a data store for design data may have a multi-tiered architecture, in some embodiments. For example, a three-tiered architecture is illustrated in FIG. 2. In this example, a presentation layer or user layer may be implemented as a client application, as in block 210. A service layer may include both application or business logic (as shown in block 220) and one or more Application Programming Interfaces (shown as APIs 230). The data layer, in this example, may include one or more relational databases, such as relational database 240.

One example of a relational database that may serve as the persistent data repository for integrated circuit design data is an Oracle™ database, although other relational databases may be used as the data repository in other embodiments. In one embodiment, an Oracle™ relational database is used as the data store for design data, as in relational database 240 of FIG. 2. A design analysis application employing a relational database may in some embodiments support both top-level and hierarchical layout data. Such an application may also provide features for partitioning data, for employing function-based indexes, for creating and maintaining transportable tablespaces, or for other features useful for managing very large databases. Examples of these features are described later.

In addition to storing all the persistent CAD data, the relational database, such as relational database 240, may also store procedures for providing data for various analyses and reporting tasks, in some embodiments. These procedures may be stored in the database as compiled procedures or may be compiled when used, according to different embodiments. In other embodiments, procedures for accessing data in relational database 240 may be stored elsewhere, such as in memory associated with the client or service layers illustrated in FIG. 2 or on a different computing node than the ones containing these components of the design analysis application.

In the design analysis application described herein, an intermediate layer of software code, such as the service layer components 220 and 230 shown in FIG. 2, may facilitate data mining and analysis of design data stored in relational database 240. This software code may include operations or commands that are supplied with or built into the code implementing relational database 240 and/or may include custom software for implementing such operations or commands, according to different embodiments. In one embodiment, the design analysis application may be developed as a 3-tier application with a Java console (thin client) as presentation or user interface layer 210, a Java middle-tier service layer (component 220 and/or 230) and an Oracle™ relational database as the backend persistent repository of data (relational database 240). In such embodiments, geometric or spatial data, such as layout data, may be stored in the database and managed according to the built-in functionality of the Oracle™ Spatial application. In such embodiments, Oracle™ Spatial's capability for supporting geometric/spatial data may be leveraged during implementation of the integrated circuit design and/or for later data mining and analysis, as described later.

Oracle™ Spatial is designed to facilitate spatial and geometric data management. In the Spatial object-relational model, the geometric description of a spatial object is stored in a single database element of object type SDO_GEOMETRY in a user-defined table. Oracle™ Spatial provides a spatial indexing mechanism (an R-Tree index) and a rich set of operators and functions for performing area-of-interest queries, spatial join queries and other spatial analysis operations. In some embodiments, these features of Oracle™ Spatial may be leveraged by the design analysis application described herein.

A service layer in the middle tier of the design analysis application architecture illustrated in FIG. 2 may encapsulate all business logic and provide the implementation of the client APIs that are exposed to the user interface, as shown in blocks 220 and 230. In some embodiments, application/business logic 220 of this service layer may be implemented as a Java service layer that connects to relational database 240 using Java Database Connectivity (JDBC). APIs 230 of the service layer may in some embodiments connect with relational database 240 using the Oracle Call Interface (OCI).

As previously noted, a system and method for applying a relational database to integrated circuit design and analysis may in some embodiments be configured to generate graphical and tabular reports regarding design data, such as layout and timing data, so that designers may easily and quickly analyze this data. Using a relational database as the persistent data store for design data may allow report generation without first spending a lot of time reading all of the design data into memory, in some embodiments. In some embodiments, application code for generating these reports may be included in application/business logic 220, while the user interface for invoking report generation may be implemented user interface layer 210. In other embodiments, report generation code may be included in user interface layer 210 or may be partitioned differently between the tiers illustrated in FIG. 2 or other numbers of tiers, according to the particular system configuration.

Design layout data is largely spatial or geometric data. Therefore, in some embodiments, analysis of this data may be facilitated using geometric or spatial operations on the data. In embodiments in which the underlying relational database is an Oracle™ database, features of the Oracle™ Spatial™ product may be employed for this purpose. For example, the functions built into Spatial™ may allow users to perform spatial queries on the layout data stored in an Oracle™ database. In some embodiments, such built-in functionality may be enhanced using middle tier APIs to write design data directly into the relational database and to read it back from the database, rather than reading and writing ASCII files produced by various CAD tools used in the design flow. For example, the built-in functionality of Oracle™ Spatial™ may be applied to design layout data to determine the area of various geometric shapes, the total area utilized on each layer of the design for one or more design blocks, the amount of overlap between shapes on various layers, the number of shapes on a given layer, or the density of shapes on a given layer, among other things. In other embodiments, functionality similar to that provided by the Oracle™ Spatial™ product may be implemented in standard or custom application code (included in service layer 220 or user interface layer 210) or in a combination of application code and functionality built-into the relational database of the design and analysis system.

As illustrated in FIG. 2, user interface layer 210 may be implemented as a thin client, such as a Java™ GUI console, in some embodiments. User interface 210 may be used to invoke the client APIs for operating on the database objects of relational database 240. In such embodiments, communication between user interface layer 210 and service layer 220 may be based on Remote Method Invocation (RMI). User interface 210 may in some embodiments include commands to provide a rich set of tabular and graphical reports on the design data, including layout data, timing data and clock flow data, which may be displayed, printed, or stored. The user interface may be configured to provide designers with different ways of linking different design data sets, including various abstractions of the same design, various abstractions of different versions of a design, or various abstractions of different designs. It may also support the viewing of the raw layout or netlist data instead of or in addition to generated layout, timing, or other reports, in some embodiments. Thus, the system may be configured to support visual correlation of layout data and timing data. For example, a user may be able to view timing and layout data together for a given shape, circuit feature, or identified design violation, either as timing information overlaid on a layout view or in separate windows with labels and/or highlighting on the layout view to indicate the corresponding timing data in the timing view. In another example, a designer may be able to access data for one or more design blocks and to view the layout data for each block, along with any timing violations for each block, in one place. In some embodiments, the user interface may include functions to "zoom-in" or "zoom-out" on certain areas of the layout, allowing a designer, for example, to drill down to a particular net and look at its capacitance, to highlight specific nets on the layout, or to highlight the nets on a specific violated path. This cross-probing between layout data and timing data may in some embodiments facilitate designers connecting different pieces of information easily, thereby increasing productivity, and may be applied to other combinations of design data types (e.g., noise data, clock data, test data) in other embodiments.

While the examples illustrated herein include a three-tiered architecture, in other embodiments a system and method for applying a relational database to integrated circuit design and analysis may include more or fewer tiers or may be implemented as a single integrated application. The system and method may in some embodiments include a single, centralized relational database as the persistent data store, while in others the relational database described herein may be implemented as a distributed database, such as one distributed among multiple computing nodes communicating across a network. In still other embodiments, the functions and structures described herein as being included in a particular one of the three tiers illustrated in FIG. 2 may instead be included in a different tier or may be partitioned into more or fewer hardware or software components included on more or fewer tiers of such a system.

The use of a relational database as a design data repository as well as an API or other service layer to access and process the design data may in some embodiments provide a design analysis environment that allows cross-probing of various types of CAD data, such as layout, timing, noise, clock, and power data, through a single application. Such an environment may also provide functionality to generate statistical reports on different data sets in various types of graphical formats, such as bar charts, pie charts, stacked bar charts, contour graphs, etc. For example, an Oracle™ database together with a Java™ service layer, Java™ Graphical User Interface, and one or more API's, may allow data output from two or more CAD tools used in an integrated circuit design flow to be stored, retrieved, cross-probed, and analyzed to produce timing violation reports, slack reports, and layout reports (such as those described herein), and other statistical reports. These reports may in some embodiments allow designers to easily pinpoint design errors or weaknesses. Using a relational database as the persistent data store for design data may also allow multiple designers to view the'same data and perform various data mining tasks on it concurrently, in some embodiments.

A design analysis environment employing a relational database as a data store for design data may in some embodiments facilitate investigation of modifications or corrections to an integrated circuit design prior to implementing the modification or correction in the design environment. For example, if an error or weakness is indicated by one or more reports generated in the design analysis environment, a designer may modify the contents of the relational database and re-generate the report(s) to see if the weakness or error has been improved or corrected. In some embodiments, such modifications may be proliferated in real time, such that other designers viewing or querying the design data may access the modified data when querying the modified portion of the database. In other embodiments, modifications may be made to a copy of the data stored in the relational database, rather than to the persistent data store. In such embodiments, if a modification proves to have achieved the desired result, the system may be configured to update the persistent data store automatically, while in other embodiments, a designer may need to explicitly invoke an update to the data store. In still other embodiments, modified design data may need to be exported to one or more CAD tools for use in a subsequent design step.

Design data of different types may be stored in a relational database according to various data models. For example, in some embodiments, layout data and timing data may be stored in a relational database. In some embodiments, each integrated circuit design may be partitioned into functional blocks, such as a CPU, a timer, or a memory array. The design data for each functional block may be represented by one or more design libraries, in some embodiments. In other embodiments, a design "library" may correspond to any functional block or any arbitrary partition of an integrated circuit design. Each of these libraries may, in turn, contain various building blocks (cells) of the design, in some embodiments. The relational database may store the name and/or corresponding numerical identifier of a library, along with identifiers of the cells included in the library and other information. Design data may in some embodiments be loaded into staging tables of the relational database and other tables may be generated based on the data in one or more of these staging tables. These tables may represent the hierarchical nature of the design data, in some embodiments. Each cell of a design may be represented in the relational database by multiple views of different view types. In some embodiments, each of these views may represent the design during a different phase of the design. For example, an "abstract" view may be useful when generating or analyzing a chip-level floor plan, before any detailed layout data is available, while a "routed" view may represent the design layout at a much later stage of the design.

FIG. 3, for example, illustrates two staging tables containing layout data, according to one embodiment. In this example, stage_layout_data 350 may include multiple, similar records in a relational database, each of which represents one top-level geometry, or shape, for a given library/cell/view combination in a layout design. This table includes a unique database identifier (db_id) for each geometry, along with seven attributes of the geometry it represents. In other embodiments, database records representing layout design geometries may include more, fewer, or different attributes.

The attributes stored in each database record of stage_layout_data 350 include the design layer on which the shape is located (layer_name), the purpose of the layer (purpose_name), the net associated with the shape (net_name) and the coordinates of two diagonally opposite corners of the shape (x1, y1, x2, y2). In this example, the shape may be a rectangle, which may be fully defined by these two corners. If the geometry represented by stage_layout_data 350 has a different shape, other numbers of corner coordinates may be included in the table to define its shape and location in the layout, according to various embodiments. In some embodiments, layout data staging tables, such as stage_layout_data 350, may be loaded by parsing the output file of a layout editing or placement/routing tool. In other embodiments, the output of a layout, synthesis, or placement/routing tool may be translated from a native tool format into the attributes to be stored in the staging table.

Note that in this and other database tables illustrated herein, the data type of each database item is shown along with the database item name. For example, the unique database identifier, db_id, is of type "number", while value of the layer_name attribute may be stored as a string of up to 100 characters, such as ASCII characters.

The second staging table illustrated in FIG. 3 is stage_layout_inst 370. This table, or a similar table, may be used to define the hierarchy of layout objects in the design. For example, stage_layout_inst 370 may include many similar records in a relational database, each representing one instance of a geometry in the design hierarchy. In this example, stage_layout_inst 370 includes a unique instance identifier (instance_id) for each geometry instance, along with eleven attributes of the particular geometry instance defined by the record. In other embodiments, database records representing a layout design hierarchy may include more, fewer, or different attributes. In addition to the coordinates of the geometry (bbox_x1, bbox_y1, bbox_x2, bbox_y2), each record of stage_layout_inst 370 includes attributes specifying placement details for the particular geometry, such as mirroring, translation, and rotation information. For example, if a particular shape is repeated in rows and columns in the design (as may be the case for one or more shapes repeated throughout a memory array), individual shapes may be mirrored or rotated (such as in alternating rows or columns), in addition to being translated along the x or y axis, in order to compact the array into the smallest possible area. Records such as the one illustrated by stage_layout_inst 370 may be used to store information about the placement of each repeated instance in the database. In some embodiments, layout instance staging records, such as those in stage_layout_inst 370, may be loaded by parsing the output file of a layout editing or placement/routing tool. In other embodiments, the output of a layout, synthesis, or placement/routing tool may be translated from a native tool format into the attributes to be stored in the staging table.

Figure 4:
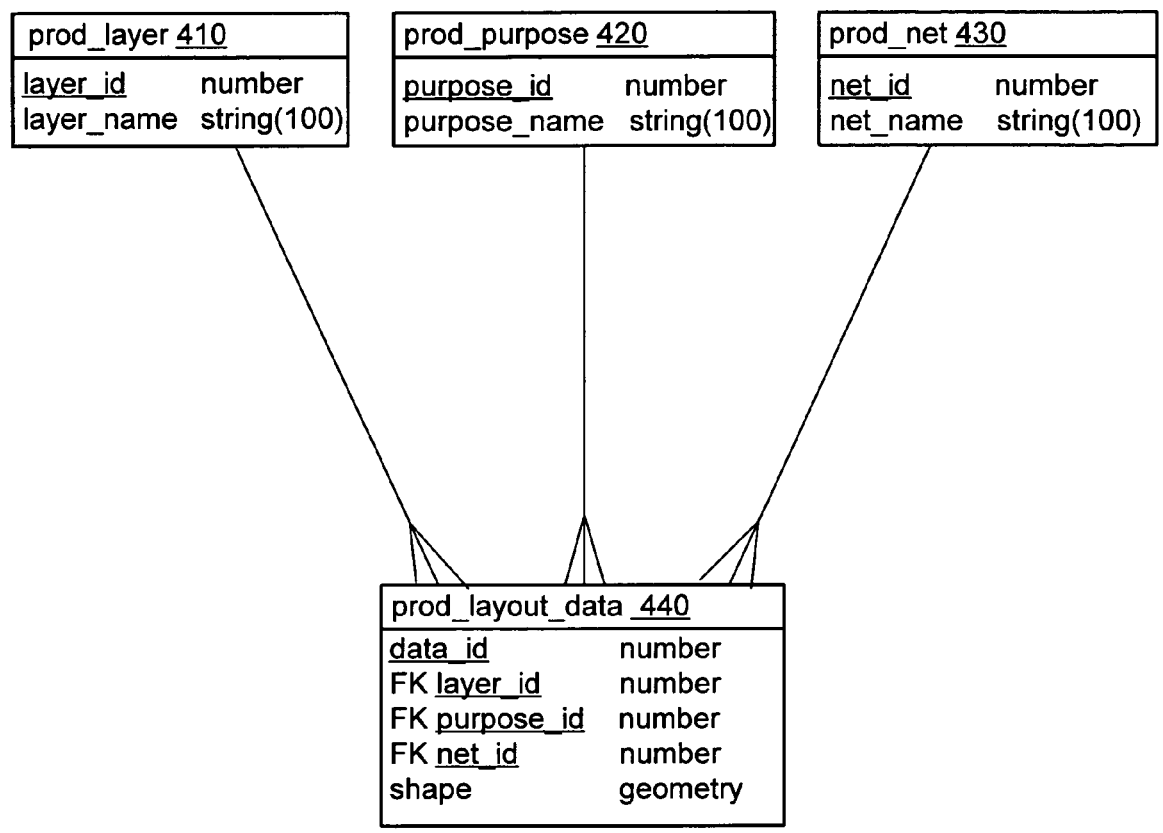
FIG. 4 illustrates production tables of a layout data model, according to one embodiment.
Figure 5:
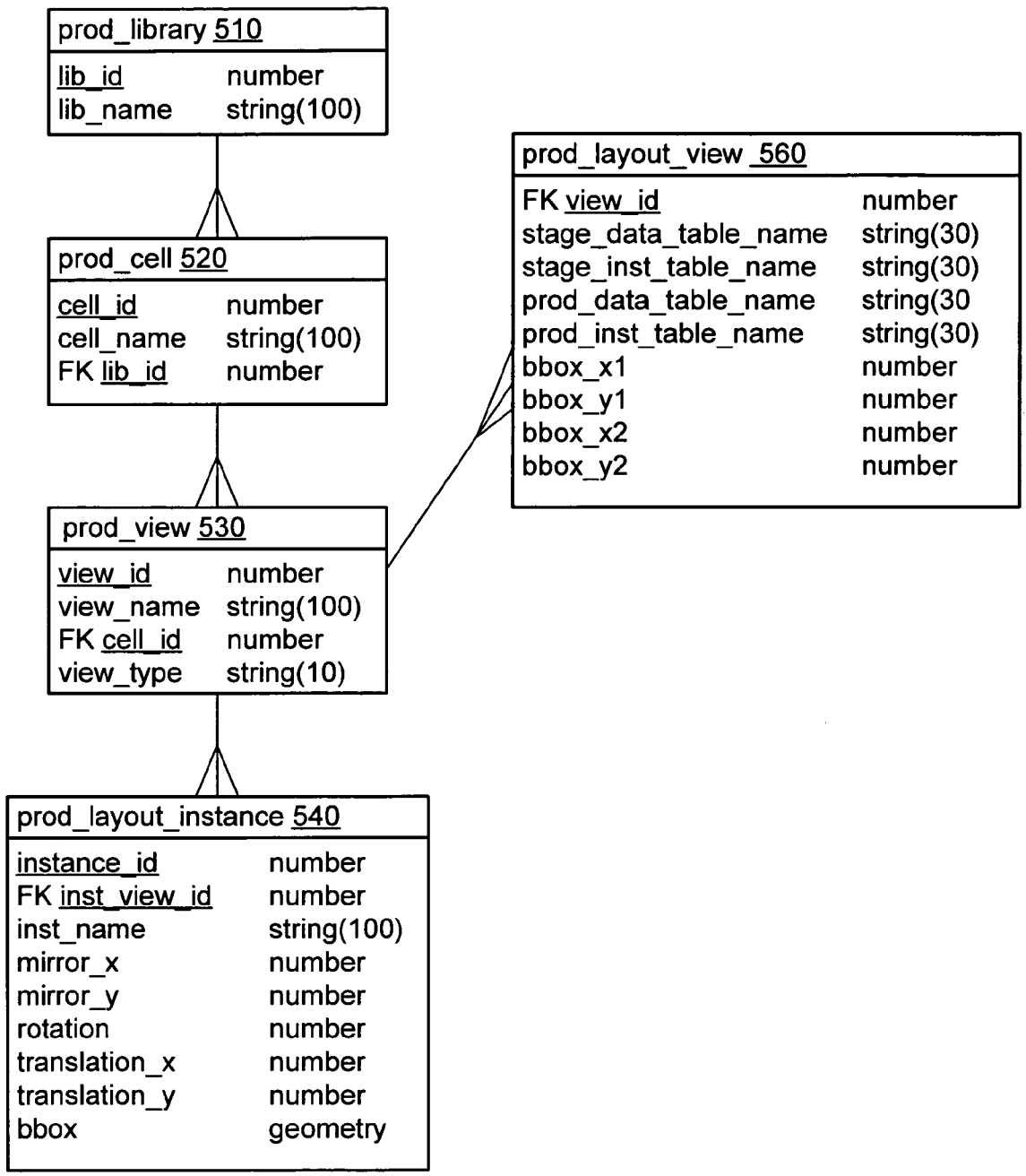
FIG. 5 illustrates additional, production tables of a layout data model, according to one embodiment.

From staging tables, such as those illustrated in FIG. 3, production database tables may be constructed, in some embodiments. In some embodiments, custom software code may be used to process and/or transform the data in staging tables to production database tables. FIGS. 4 and 5 illustrate examples of production database tables for layout design data, according to one embodiment. As illustrated in FIG. 4, some database entries may be used to specify mappings between attribute names and attribute numbers. For example, prod_layer 410 may include multiple database records, each of which defines a mapping between a layer identification number and a design layer name, such as "metal 1" or "poly". Similarly, prod_purpose 420 may include several database records, each of which defines a mapping between a purpose identification number and a purpose name, such as "drawing" or "pin", and prod_net 430 may include multiple database records, each of which defines a mapping between a unique net identifier and a net name, such as a signal name in the design.

Another production database record for layout data, as shown in FIG. 4, is prod_layout_data 440. In this example, prod_layout_data 440 may include multiple database records, each of which represents a geometry, or layout shape, in the design. The attributes illustrated in prod_layout_data 440 are similar to those of stage_layout_data 350, but they have been translated from the formats of the staging table to the production table as follows. A new unique data identifier (data_id) may be generated for each geometry in the production layout data table, as illustrated. The layer, purpose, and net names of the staging tables may be replaced by numerical identifiers of these attributes, according to the mappings of multiple tables 410, 420, and 430. Thus, records included in prod_layout_data 440 may be populated with data corresponding to multiple layout shapes having different layer/purpose/net combinations, in some embodiments. As illustrated in 440, each of these records may have a unique data identifier, data_id.

Note that in this and other database tables illustrated herein, the designator "FK" indicates an attribute that is inherited from another database record, and is, thus, a "foreign key" in the current table. For example, the nomenclature "FK layer_id" indicates that the layer identification number for the layout geometry represented by prod_layout_data 440 is specified in a prod_layer 410 table, which maps the layer_id number to the layer_name found in its corresponding staging table. Note also that in this and other database tables illustrated herein, an attribute name that is underlined is an attribute that serves as a primary key to the current database table. That is, the value of this attribute may be unique to the database and may in some embodiments serve as an index into the relational database.

The last difference between the production layout data table prod_layout_data 440 and the corresponding stage layout data table stage_layout_data 350 is that the coordinates of the geometry have been replaced by an attribute called "shape" of data type "geometry." In this example, "geometry" may be a complex data type, such as a new class of an object oriented description language, in some embodiments. In embodiments in which the Oracle™ Spatial™ product is used, the data type of the "shape" object may be the built-in spatial data type "SDO_GEOMETRY". Transforming the stage layout data (including geometry coordinates) into the production layout data (in which the shape is represented by this spatial data type) may in some embodiments facilitate operating on layout design data using geometric and spatial operations for design analysis and report generation. In some embodiments, production layout data records, such as the one illustrated by prod_layout_data 440, may contain top-level shapes only, while in other embodiments, each layout data object, no matter its position in a layout hierarchy, may be represented by a similar, individual database record.

In some embodiments, once a production layout data record has been constructed corresponding to a stage layout data record, the stage layout data record may be archived and/or deleted, while in other embodiments, both records may be maintained in the relational database. In some embodiments in which the staging data is not maintained, the data identifier of the production layout data record may be the same as the identifier used in the corresponding staging table. In still other embodiments, staging tables, such as those described herein, may be maintained in a different database than the production tables or in a different partition of the same database.

Other database tables which may be generated using the layout staging tables illustrated in FIG. 3 are illustrated in FIG. 5. For example, prod_library 510 in FIG. 5 may include several database records, each of which maps an identifier of a library to its name. Similarly, prod_cell 520 may include multiple database records, each of which maps a cell identifier to a cell name for a given library indicated by the inherited attribute "FK lib_id". As illustrated in FIG. 5, a production database table, such as prod_view 530, may include multiple database records, each of which specifies a specific view for a particular library/cell combination. In this example, each record includes a view name and identifier (specifying a particular database object), an inherited cell identifier, and a view type (such as "abstract" or "routed").

As previously described, an integrated circuit design may include multiple instances of each library/cell/view combination. Layout data for a given library/cell/view combination may include top-level shapes for that library/cell/view combination, stored in a production table such as prod_layout_data 440. There may be multiple instances of this library/cell/view combination in the design, as well as multiple instances of other library/cell/view combinations. Each library/cell/view combination may in turn contain instances of other library/cell/view combinations. This design hierarchy may be represented in various staging tables, such as stage_layout_inst 370, and in various production database tables, such as prod_lib 510, prod_cell 520, prod_view 530, and prod_layout_instance 540. Each instance may be represented in the various tables by a different database record, as illustrated in prod_layout_instance 540. In this example, each record includes a unique instance id, an instance name, an inherited instance view id, and information specifying the placement and orientation of the particular instance, similar to the information in stage_layout_inst 370. In this example, instead of including the coordinates of a bounding box for the instance, each record may include the bounding box attribute, specified as value(s) of the complex data type "geometry."

Another production database table illustrated in FIG. 5 is prod_layout_view 560. In this example, each record of prod_layout_view 560 includes an inherited view identifier, view_id; stage_data_table_name, which stores the name of the staging table that contains the data for the top-level shapes for that view; stage_inst_table_name, which stores the name of the staging table that contains the instance data for that view; prod_data_table_name, which stores the name of the production table that contains the top-level shapes and that corresponds to the staging table specified by stage_data_table_name; prod_inst_table_name, which stores the name of the production table that contains instance data and that corresponds to the staging table specified by stage_inst_table_name; and coordinates of the overall bounding box for that view. In one embodiment, this bounding box represents the smallest box that can contain all of the top-level shapes and top-level instances that make up the view.

The data stored in the staging tables or production tables of the relational database may be analyzed to pre-compute commonly-requested statistics and meta-data that may be useful for analyzing the design and/or generating various design reports, in some examples. For example, the area, width, and length of each layout shape may be pre-computed and stored in the database, in some embodiments. This data may then be combined with other data to produce higher-level statistics, such as the metal 1 density in a design block, the number of metal 2 shapes in a given area, or the total number of via shapes in a given cell.

As previously noted, custom software code or functions built into a relational database system may operate directly on geometric data to facilitate generation of various design statistics or reports. For example, embodiments employing an Oracle™ database including the Oracle™ Spatial™ application may use any of its built-in geometric functions in generating statistics or reports, including the following:

SDO_GEOM.RELATE: Determines how two objects interact. Two objects may be analyzed to determine if there is any interaction between them, and/or if one object contains the other, is covered by the other, is disjoint from the other, is equal to the other, is inside the other, etc.

SDO_GEOM.SDO_AREA: Computes the area of a two-dimensional polygon.

SDO_GEOM.SDO_DIFFERENCE: Returns a geometry object that is the topological difference between two objects; a MINUS operation of two geometry objects.

SDO_GEOM.SDO_DISTANCE: Computes the distance between two geometry objects.

SDO_GEOM.SDO_INTERSECTION: Returns a geometry object that is the topological intersection of two geometry objects; an AND operation of two objects.

In some embodiments, similar operations may be constructed using custom software or functions included in other components of an integrated circuit design environment. These geometric operations may be combined with other functionality of the relational database and design software to generate pre-computed statistics and other design reports.

Figure 6:
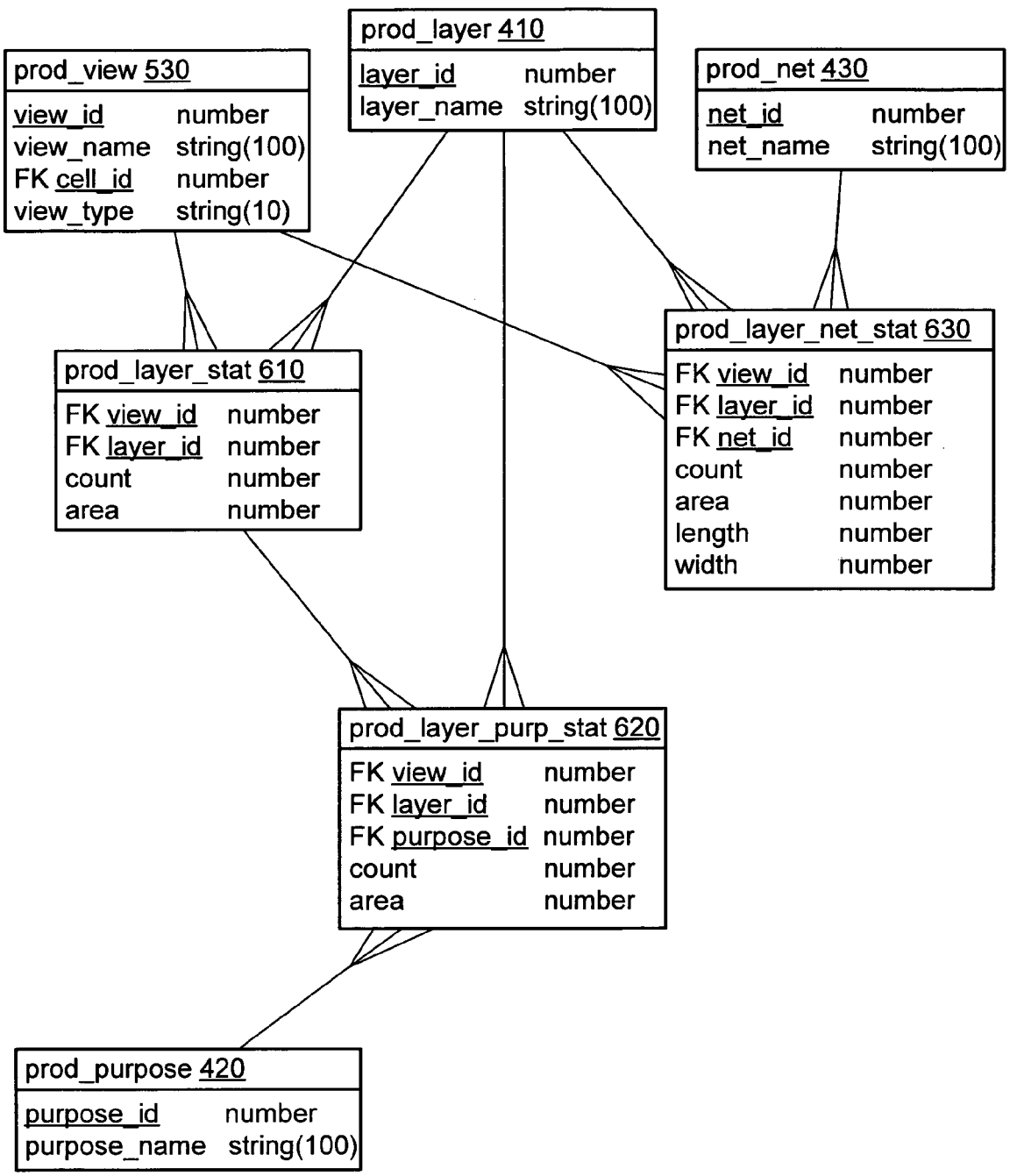
FIG. 6 illustrates database tables containing layout statistics, according to one embodiment.

Some examples of pre-computed statistics for design layout data are illustrated in FIG. 6. As illustrated, each record of a production layer statistics table, prod_layer_stat 610, may include, for a given view/layer combination, the number of shapes on that layer in that view ("count"), and the total area on that layer in that view ("area"). Another database table may include layout statistics for a given view/layer/purpose combination, as in prod_layer_purp_stat 620. In this example, only the shapes of the previous table that have a given purpose may be included in the calculation of shape count and area for each record. In another example, prod_layer_net_stat 630 illustrates a database records including statistics for a given view/layer/net_id combination. In each of these records, the shapes on the given layer, for the given view, and for the specific net (identified by the net_id) may be included in calculations of shape count, area, length, and width.

Timing data for an integrated circuit design may also be stored in the relational database, in some embodiments. As with layout data, timing data may in some embodiments be loaded into staging tables before production database records are loaded. For example, FIG. 7 illustrates two staging tables for timing information. The first table, stage_timing_data 730 may include multiple records, each representing a snapshot of timing data from a particular timing analysis run. In this example, a "batch" may correspond to a set of data for a specific combination of block, run, and timing analysis type (min, max, typical, etc.). Each record of stage_timing_data 730 may include a batch identifier, a path identifier (for the timing path being analyzed), a path type (specifying whether the analysis is to check for a timing "violation" or for "slack"), a path name, and the result of the run, "delta", specifying the value of the violation or slack (positive or negative). Timing data, such as that illustrated in stage_timing_data 730, may be loaded directly from the output of a timing analysis tool into staging or production database tables, in some embodiments. In other embodiments, re-formatting or pre-processing may be performed before loading timing data from a timing analysis tool into the relational database.

Another staging table for timing data is illustrated as stage_timing_data_detail 750. In this example, each record may include more detailed timing information for a particular timing batch. For example, each record may correspond to a particular batch/path combination and may include the inherited identifiers of the batch and path. Each record may also include a net sequence number (corresponding to a specific ordering of the nets in a path), one or more net, gate, cell, and/or pin names for which timing data is recorded, and values for the actual timing data from the timing analysis run. For example, each record may include the value of the net delay for a specified net, the gate delay for a specified gate, the slew for a specified pin, or the fanout for a particular pin.

Figure 8:
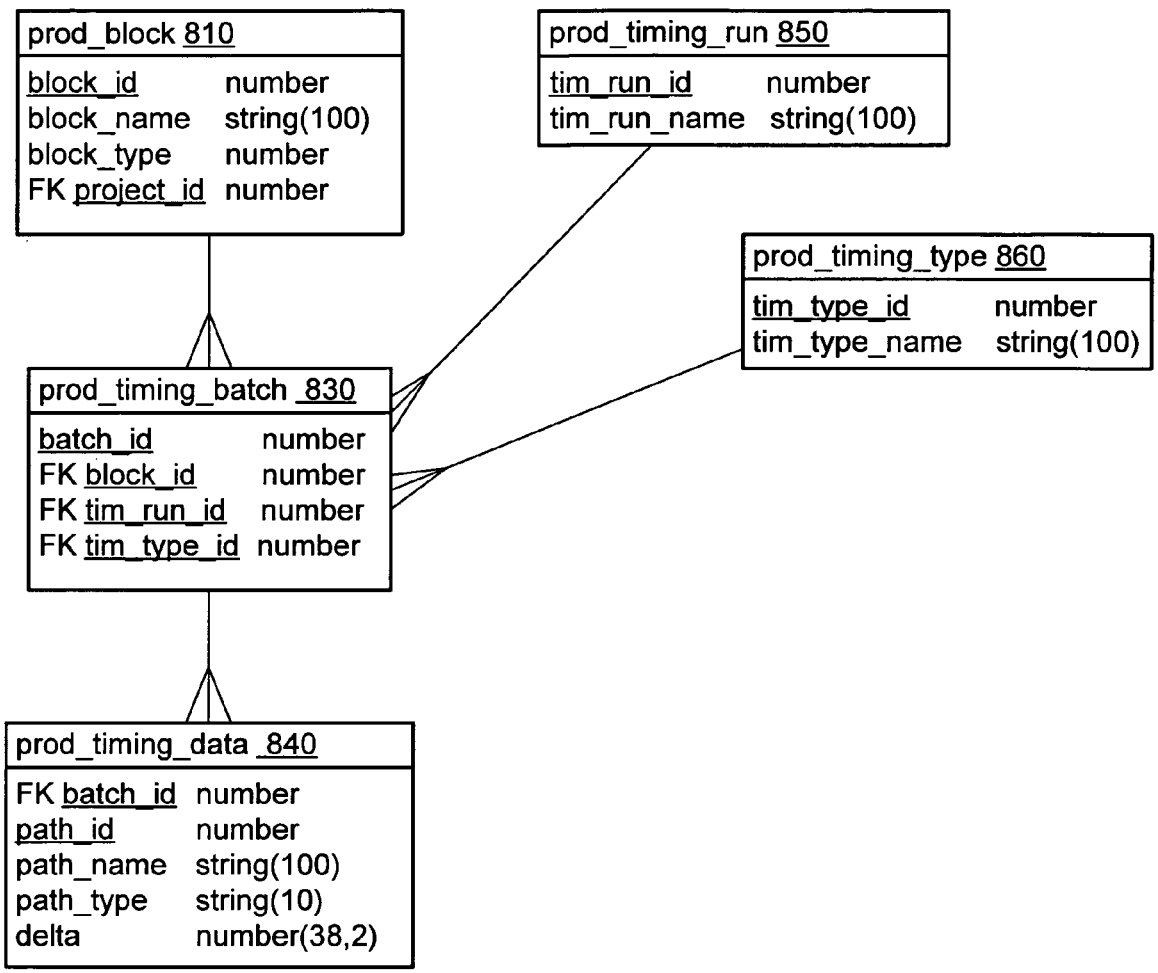
FIG. 8 illustrates production tables of a timing data model, according to one embodiment.
Figure 9:
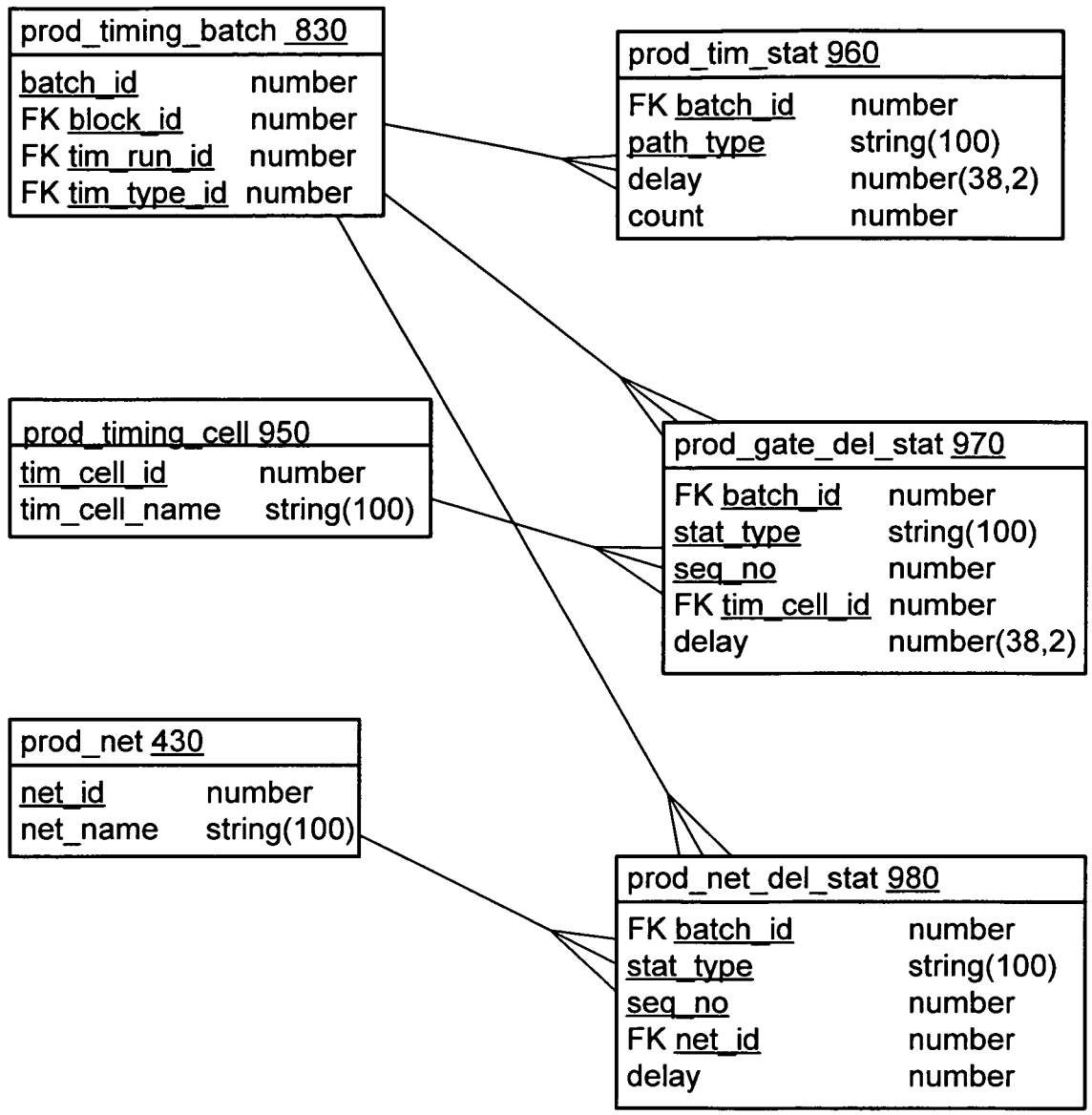
FIG. 9 illustrates database tables containing timing statistics, according to one embodiment.

Production database tables may be generated based on data from one or more timing data staging tables, in some embodiments. FIGS. 8 and 9 illustrate various production database tables corresponding to timing data of an integrated circuit design. The first table shown in FIG. 8 prod_block 810 illustrates additional levels of hierarchy that may be present in the design data. In this example, a "block" may correspond to a functional block of the design, similar to the "library" of the layout data model described above. Each block of the design may represent, for example, a CPU, a timer, a memory array, or any other functional block or arbitrary partition of an integrated circuit design. Another level of hierarchy may be represented by a project identifier, such as the inherited project_id shown in prod_block 810. A "project" may correspond to the design of an integrated circuit containing multiple functional blocks, in some embodiments, such as an entire integrated circuit device or a sub-system thereof. Note that in some embodiments, a user may add one or more levels of hierarchy to a design, such as by sub-dividing a project, block, library, etc. In such embodiments, these additional levels of hierarchy may simplify or speed up design analysis or generation of various design reports. For example, adding additional levels of hierarchy may reduce the time and/or memory required to perform electro-migration and IR drop analysis, which may be very compute-intensive.

The next table shown in FIG. 8 is prod_timing_batch 830. In this example, each record of prod_timing_batch 830 specifies a batch identifier for a specified combination of a functional block, a timing run (snapshot), and a timing type (e.g., min, max, typical). The timing run identifier shown in prod_timing_batch 830 may be mapped to a timing run name in one record of prod_timing_run 850, which includes other such mappings. Similarly, the timing type identifier of prod_timing_batch 830 may be specified in one record of prod_timing_type 860, which includes other such mappings.

Finally, FIG. 8 includes prod_timing_data 840. This production database table includes, for each record, an inherited batch identifier (as described above), a path identifier, a path name, a path type (violation or slack), and the result data "delta" which may be positive or negative to indicate the amount of the violation or slack reported by the timing analysis run.

Some production database tables for timing data may be used to store pre-computed, commonly-used statistics that may be used to generate various design reports, in some embodiments. Some examples of these tables are shown in FIG. 9. For example, prod_tim_stat 960 includes multiple records, each of which includes an inherited batch identifier, a path type, a delay value and a count value. Each record of this table may, for example, represent a binning according to the path type (violation or slack) and a different range of values for delay_value. For example, a single record may store the number of violations and the number of slack paths for one of several 10 pico-second delay_value ranges.

Another example database table is prod_gate_del_stat 970. In this example, each record may include a gate delay value for a specific batch/cell/sequence combination. Similarly, prod_net_del_stat 980 may include records corresponding to a net delay value for a specific batch/net/sequence combination. In some embodiments, these pre-computed gate and net statistics may be combined with each other and/or with additional information when generating design reports. For example, one statistic may be Top Ten Gates (i.e., those having the largest delay value) and another may be Top Ten Nets (i.e., those having the largest delay value.) In other embodiments, these statistics may be generated from staging or production database tables during report generation, rather than being pre-computed and stored in the database for future use.

While several examples of database tables for layout and timing data have been described in detail, it should be understood that other database tables may be created using other design data or combinations/transformations of design data for other purposes, such as different types of displays, analyses or reports, according to different embodiments. Also, while the example databases described herein include staging tables into which design data may be loaded before it is translated/transformed for storage in production tables, in other embodiments, design data may be translated/transformed directly from EDA tool output files to models suitable for production tables and loaded into the relational database as such.

The type of software used for loading design data into a relational database may depend on the type of relational database used as the persistent data store. For example, if the relational database is an Oracle™ database data loading software may use an Oracle Call Interface™ (OCI), which provides C APIs for performing array inserts into a database. In some embodiments, data loading software such as this may be used to do batch loading of large amounts of design data into staging tables, as described above. In other embodiments, other APIs provided with a relational database and/or custom software may be used to load design data into a relational database.

After design data is loaded into staging tables, it may be transformed and loaded into production tables, as described herein. Design data tables, such as layout data tables, may contain very large amounts of data. These large volumes of data may in some embodiments be managing through partitioning, such as with Oracle™'s built-in partitioning feature. Partitioned tables may allow data to be broken down into smaller, more manageable partitions, or even sub-partitions. In some embodiments, partitioning may facilitate database management by easily accommodating growth (by adding partitions) as well as loading, deleting, and adding data. Similarly, querying may be carried out only in specific partitions, rather than by accessing larger portions of the tables, in some embodiments.

Therefore, in some embodiments, design data may be partitioned according to various attributes of the data. For example, layout data may be partitioned according to layer (layer_name or layer_id), and indexed accordingly in the production database tables. Similarly, layout data may be partitioned according to purpose (purpose_name or purpose_id), and layout or timing data may be partitioned according to net name or net identifier. For each table, local indexes may be generated which allow one-to-one mapping between index partitions and table partitions. For example, shape column of type "geometry" may be indexed using a local spatial R-tree index, in some embodiments.

Design data may be transformed into different data representations during transfer to production tables, in some embodiments. For example, layout data may be transformed by converting raw geometric data into data described using the complex data type "SDO_GEOMETRY", in some embodiments. In some embodiments, database tables may be created in a parallel scan operation, such as the one supported by Oracle™ as part of the CREATE TABLE operation. In such cases, full table scans of a staging table may be performed when transferring data to production tables. As part of data transfer, a unique id may be assigned to each row of data, as illustrated in the example database tables herein. In some embodiments, this id may be copied from a corresponding staging table record, while in other embodiments, this id may be different then a corresponding staging table record id, and may be generated and assigned at the time the production database tables are created.

A relational database for use in integrated circuit design and analysis may support more than one type of user of a production database instance, in some embodiments. For example, a production database instance may have an assigned database "owner", i.e., a database user that owns all the production database objects: tables, indexes, sequences, functions, procedures, etc. Other database users may be designated as application users, in some embodiments. These application users may be granted appropriate access to the database objects by the owner. In some embodiments, application users may have read-only access to production database tables, and only the owner may have read-write access to the production database tables. In other embodiments, all users (application users as well as database owners) may have read-write access to the production database tables, or the owner may grant read-write access to various production tables on a per-user or as-needed basis. In various embodiments, an application user's modifications to database tables may be made to copies of the tables, rather than to the tables in the centralized data store, and may be proliferated to the centralized data store and/or to other application user's copies automatically or through an explicit command executed by the application user or database instance owner.

Design data for an integrated circuit design may include tables of widely varying sizes, depending on the type of data, the partitioning of the data, and how the tables will be used by various applications in the integrated circuit design and analysis environment. In some embodiments, the database may be divided into two or more tablespaces, according to the size of the tables in those spaces. For example, one database may divided into a small tablespace, in which tables containing hundreds or thousands of records may be created, and a large tablespace, in which tables containing millions of records may be created. In one example, layout data may be created in a large tablespace, while data representing other abstractions of the design (timing, clocks, noise, test models, etc.) may default to tables in a small tablespace. Similarly, two or more index tablespaces may be created for managing the indexes that are created on corresponding small and large tables. In some embodiments, databases containing multiple tablespaces may manage each tablespace locally, and may track all extent information in each tablespace itself.

A relational database may be used as a persistent data store and integrated into an integrated circuit design methodology at different stages of a design, according to various embodiments. One method for integrating a relational database into a design methodology is illustrated by the flow chart in FIG. 10. In this example, several data loading operations and data analysis operations are interleaved with the basic design operations of FIG. 1. After a design is implemented as a netlist, for example, at 1010, the relational database may be loaded with data representing the netlist at 1015. After circuit simulation is performed, as in 1020, the results of the simulation may also be loaded into the database, as in 1022, and reports may be generated from the data in the database, as in 1025. Examples of the types of reports that may be generated during an integrated circuit design are described in more detail later.

Once the layout representation of the design is complete, or at various stages of the layout design, shown at 1030, layout data may be added to the relational database, as shown at 1032. This data, whether in staging tables or production tables, may be used to generate various layout design reports, as in 1035. Each time a design rule check (DRC) is performed on the layout design, as in 1040, the results may be added to the relational database, as in 1045.

Similarly, once circuit extraction has been performed, at 1050, parasitic data may be loaded into the database, as in 1052, and used, along with other data in the database, to produce various design reports, including comparisons with expected electrical characteristics of the design, as in 1055.

Data related to layout versus schematic (LVS) checks may be loaded into the database at 1065. Once the design is DRC and LVS clean, post-layout simulations may be performed, as in 1070. These post-layout simulations may in some embodiments include timing simulations, clock simulations, power or noise analysis, or any other suitable analysis of the design for quality, correctness, completeness, performance, etc. Results of these simulations may also be included in the relational database, in some embodiments.

Any of the data in the relational database may be used to generate design reports on the completed design, as in 1075. These reports may be used to validate that the design meets its specifications for timing, power, clocking, noise, test, etc., in some embodiments, or to indicate errors or deviations from the specification. If additional design iterations are performed, as indicated by feedback arrows in FIG. 10, additional design data may be added to the relational database following design changes, or new design data may replace (overwrite) existing data in the database, according to various embodiments.

Figure 10:
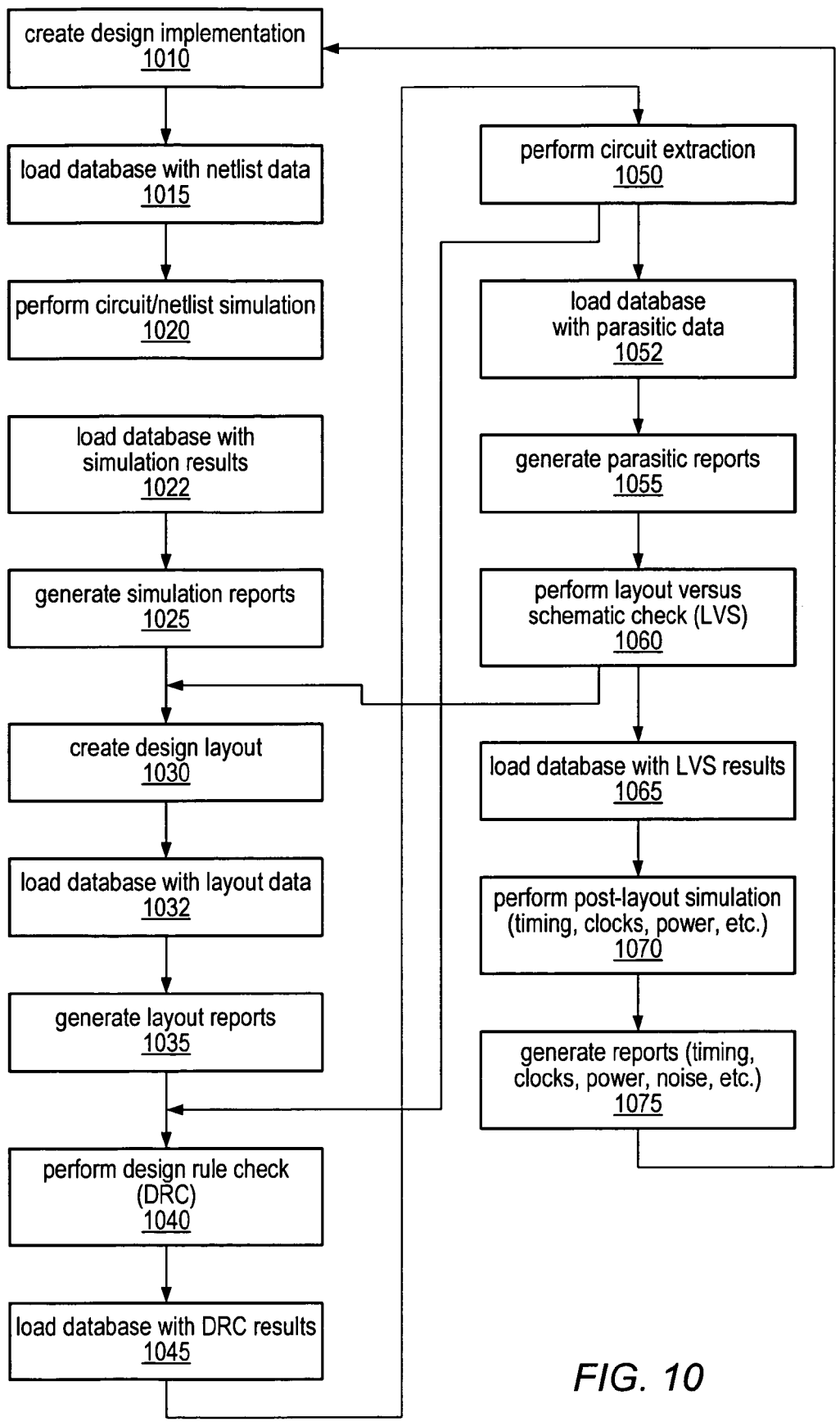
FIG. 10 illustrates one embodiment of a method for creating an integrated circuit using a relational database as the persistent data store.

While FIG. 10 illustrates a design methodology in which many types of design data, including simulation, DRC, and LVS results, are added to a relational database at many different points in a design cycle, in other embodiments, more, fewer, or different types of design data may be stored in a relational database during a design. This data may be added as the design is in progress, as in FIG. 10, or may be added in more, fewer, or different points in a design cycle, such as if netlist and layout data are both added after layout design is complete.

As described above, a design and analysis environment including an integrated relational database may in some embodiments provide users with commands for generating various statistical reports regarding an integrated circuit design. Several example reports for layout and timing data are illustrated in FIGS. 11A-11C.

One of the layout reports generated by using a relational database may be a "polygon count per layer" report. For example, FIG. 11A illustrates a graph of the number of shapes found on each of multiple design layout layers. In this example, the graph shows the number of shapes found on each of seven metal layers of a design, labeled m1-m7. The number of shapes on each layer is indicated by the height of the bar corresponding to the layer. For example, the bar corresponding to layer m3 has a height representing approximately 800,000 shapes, while the bar corresponding to layer m7 has a height representing less than 200,000 shapes.

Other types of layout reports may be generated by the design analysis environment described herein, according to various embodiments. For example, a report may be generated on the area covered per layer, in some embodiments. In some embodiments, a user may be able to select all layers, all metal layers, or specific layers to be analyzed for a polygon count report or an area report. In some embodiments, a user may be able to select the library, cell, and/or view to be analyzed for the report. A user may be able to specify all purposes or specific purposes for analysis, or to select a specific combination of layers, views, and/or purposes for the analysis, in some embodiments. In still other embodiments, the user may be able to specify the nets to be analyzed or a combination of net names, layers, views, and/or purposes.

Another type of report that may be generated, in some embodiments, is a Top 10 or Top "n" list of nets of a given layer. For example, a report may be generated listing the Top 20 metallized nets (other than Vdd or Vss) by area or count for a given metal layer or for a specific metal layer, that is, the list of the twenty nets having the largest metal area or highest metal polygon count. In some embodiments, this information may be presented in summary form, such as in a bar chart, while in others, the report may illustrate the area or polygon count contributed by each metal layer for the nets, such as in a stacked bar chart.

Another type of layout report that may be generated is an x-axis or y-axis distribution report, such as a metal distribution report, in some embodiments. These reports may in some embodiments report the area or polygon count for one or more layers of layout data in each of several grids radiating along the X or Y axis of the design layout. For example, the layout data span may be divided into 100 grids along its X-axis and an X Axis Metal Distribution report may show the summary of the metal area or metal polygon count for each grid or the contribution of each metal layer to the total metal area or metal polygon count for each grid, in some embodiments. Similarly, metal density reports may, in some embodiments, be generated to display the density of one or more specified metal layers within a given window size, such as for a window size of 100 microns by 100 microns with a step increment of 10 microns. Such reports may allow a user to quickly identify the areas of the design in which the metal density does not meet the density rules for that window size.

In various embodiments, other types of layout design reports may be generated, according to the design data stored in the relational database and the design analysis methods employed.

Timing reports may also be generated using the design analysis environment described herein, in some embodiments. One type of timing report that may be generated is a report showing timing paths that violate their corresponding timing specifications or requirements. For example, FIG. 11B illustrates a graph of eight timing paths that violate their specified timing requirements. In this example, the timing paths are labeled path 1 through path 8. For each of these violated timing paths, the height of the corresponding bar in the graph represents the amount of the timing violation, in picoseconds (ps). For example, the height of the bar corresponding to path 1 indicates a violation of approximately 50 ps, while the height of the bar corresponding to path 7 indicates a timing violation of less than 5 ps.

Another type of timing report that may be generated using the design analysis environment described herein is a report showing the delay components of a violated timing path, in some embodiments. For example, FIG. 11C illustrates net delays and gate delays that make up the total delay for path 1 of the previous example. As shown in FIG. 11C, path 1 includes two clock nets and eight other nets, each of which contributes to the total path delay. The total path delay is calculated as the sum of all gate delays and net delays in path 1. In this example, the sum of these delays results in a total path violation time of 50 ps, i.e., the total of the gate delays and net delays is 50 ps above the target delay or the maximum delay specified for path 1.

When generating timing reports of violated paths, a user may in some embodiments specify the block name and timing run for the report. In some embodiments, the user may be able to see all the violated paths for that timing run, such as in the bar chart shown in FIG. 11B. The user may in some embodiments be able to select (e.g., "click on") a violated path in the timing report and be presented with details about the various nets and cells that make up the violated path. These details may include net delay and gate delay information, such as the information shown in FIG. 11C.

The reports illustrated in FIGS. 11A-11C may in some embodiments be generated by analyzing pre-computed statistics, rather than by computing the reported statistics at the time of report generation or by analyzing the raw layout and timing data of the staging tables described herein. For example, the bar chart of FIG. 11A may in some embodiments be generated by accessing records of one or more tables such as prod_later_stat 610 of FIG. 6.

Other timing reports that may be generated, in some embodiments, include the Top N (e.g., Top 100) paths for a particular timing run. Such a report may include both violated paths and slack, and may include labels or other visual highlighting to distinguish paths having violations from those with positive slack, in some embodiments. Other timing reports may indicate the percentage of paths that have violations versus positive slack, and/or the distribution of the amount of the violations or slack (e.g., in 10 Pico-second intervals), in some embodiments.

For each of these reports, a user may be able to select the block name and timing run for the report, in some embodiments. This selection may be performed using a command, a menu selection or other GUI implementation, or by any other suitable input mechanism. By executing multiple timing runs and generating corresponding reports, a user may in some embodiments be able to identify design weaknesses or evaluate proposed improvements. In various embodiments, other types of timing reports may be generated, according to the design data stored in the relational database and the design analysis methods employed.

For commonly-generated reports, a user may create a standard report package, containing a set of commands or procedures for generating reports, such as by using one or more stored templates, macros, or batch commands, in some embodiments. These standard report packages, commands, procedures, templates or macros may also be stored in the relational database, in some embodiments. They may be executed when explicitly invoked by a user, or automatically at one or more points in a design cycle, according to various embodiments. For example, a standard set of timing reports may be automatically generated each time a timing run is executed, in some embodiments, or a standard set of layout reports may be automatically generated each time a layout database is loaded into the relational database.

In addition to generating design reports, the design and analysis environment described herein may in some embodiments provide a user with the ability to view the integrated circuit design according to one or more abstractions of the design, by providing functions that access data stored in the relational database. For example, a user may be able to view the layout design by invoking commands that access layout data in the database by library, cell, instance, view, layer, net, etc., in some embodiments. In such embodiments, the user may be able to specify these attributes by name or by the identifier associated with the name in the database. In some embodiments, a user may be able to view layout data for a particular area of the design, such as by specifying a bounding box of an area to view. Users may also be able to use zoom-in and zoom-out functions for viewing layout data, in some embodiments.

Any data associated with a layout design may also be viewed along with, or instead of, a graphical display of the geometric shapes of the layout design, in some embodiments. For example, a user may be able to highlight specific nets on the layout design, such as by specifying a net name on a command line, a GUI menu, or by another mechanism for user input. In another example, a user may be able to select a specific net on the layout, and view the capacitance for that net corresponding to each of several timing runs.

Because the design data is stored in a relational database, cross-probing of different types of data may be performed using functions that access data representing different abstractions in the database, in some embodiments. For example, a user may be able to select a violated path from a timing report and highlight it on view of the layout design, in some embodiments. Similarly, a user may be able to highlight a net, gate, or path in a layout design and be able to view one or more timing reports corresponding to that net, gate, or path, in some embodiments. In still other embodiments, a netlist or schematic representation of a design (or a portion thereof) may be displayed and cross-referenced with layout data or data of other data types.

While many of the examples of database tables and reports described herein involve layout and timing data, an design and analysis environment and integrated relational database may be extensible to any data used by or produced by an integrated circuit design flow and/or the tools associated therewith, according to various other embodiments. For example, in some embodiments data representing clocking characteristics, noise characteristics, or power consumption may be added to the relational database and related to timing, layout, or other design data stored therein. This data may be analyzed independently or when combined with data representing other abstractions of the design to produce reports. For example, a report may be generated regarding clock distribution, noise, or power consumption by area, library, cell, view, or instance or a command may be used to highlight clock, noise, or power consumption problems, such as values that are out of specification, on a layout, netlist, schematic, or other view of the design.

Other abstractions of a design that may be represented by data in a relational database include test views and test or fault coverage views. In some embodiments, data related to testing and coverage may be stored and analyzed to identify portions of the design that contain errors or need more testing, or to track the progress of testing or coverage activities at various points in the design cycle. Design reports and/or displays of this test information may include cross-references to other types of design data, such as netlist data or layout data for an area of interest, in some embodiments.

The reports generated using a design analysis environment such as those described herein may be stored in the relational database or other memory, or may be printed, displayed, or transmitted to another device or node, according to various embodiments. For example, layout reports and timing reports may be represented by bar charts, pie charts, tables, lists, or any other suitable graphical representation of design data. In some embodiments, reports may be posted on a web site so that they may be viewed by other team members, managers, auditors, etc.

As previously noted, an integrated circuit design environment in which design data is stored in a relational database may in some embodiments be configured to allow design changes to be explored by modifying the design data in the database. This is illustrated in the flow chart shown in FIG. 12. In this example, design data may be loaded into staging tables before it is loaded into production database tables, as discussed above. This is illustrated at 1210. In other embodiments, design data may be loaded directly into production records of the database.

The design environment may be configured to pre-compute commonly-used statistics from the data in the staging tables, in some embodiments, as shown as 1220. For example, the area, width, and length of each shape in the layout design may be computed from data loaded into the staging tables. In some embodiments, stored procedures or macros may be used to pre-compute commonly-used statistics, and these procedures or macros may also be stored in the relational database. These procedures or macros may be the same for all designs or may be tailored to a particular design or technology by users during project set-up, such as by specifying values for environment variables or other parameters, according to different embodiments.

Production tables may be generated from staging tables or from raw design data before being loaded into the relational data database, according to various embodiments. This is illustrated as 1230. Several examples of production tables for layout and timing data are described above. In some embodiments, pre-computed statistics, such as those described herein, may be generated from production database tables, rather than database staging tables.

The production database tables, staging tables, and/or pre-computed statistics stored in the relational database may be queried, as in 1240, for the generation of various design reports and for various analyses of the design, as in 1250. These reports and analyses may in some embodiments include layout and timing reports, such as those described herein, and analyses involving multiple abstractions of the integrated circuit design.

If the reports and analyses indicate that the design meets all of its design criteria, at 1255, the design may be committed for fabrication, as in 1265. If not, the effect of any proposed modifications may be investigated by modifying the design data in the relational database, as shown in 1260. For example, if the design fails to meet timing for a particular path, the netlist and/or layout database may be modified to instantiate a larger driver for a particular net.

The modified design data may be queried at 1270, just as the unmodified data was, to produce reports and perform various analyses at 1280 similar to those of step 1250. These results may be compared to the results of the unmodified design to see if the proposed modification results in the design meeting its specified criteria, as in 1285. If not, the proposed changes may be discarded, as in 1295, and others investigated. If so, the proposed changes may be committed to the actual design (i.e., in the production database or in other EDA tool views or components of the design environment corresponding to the design to be fabricated), as in 1290.

Figure 12:
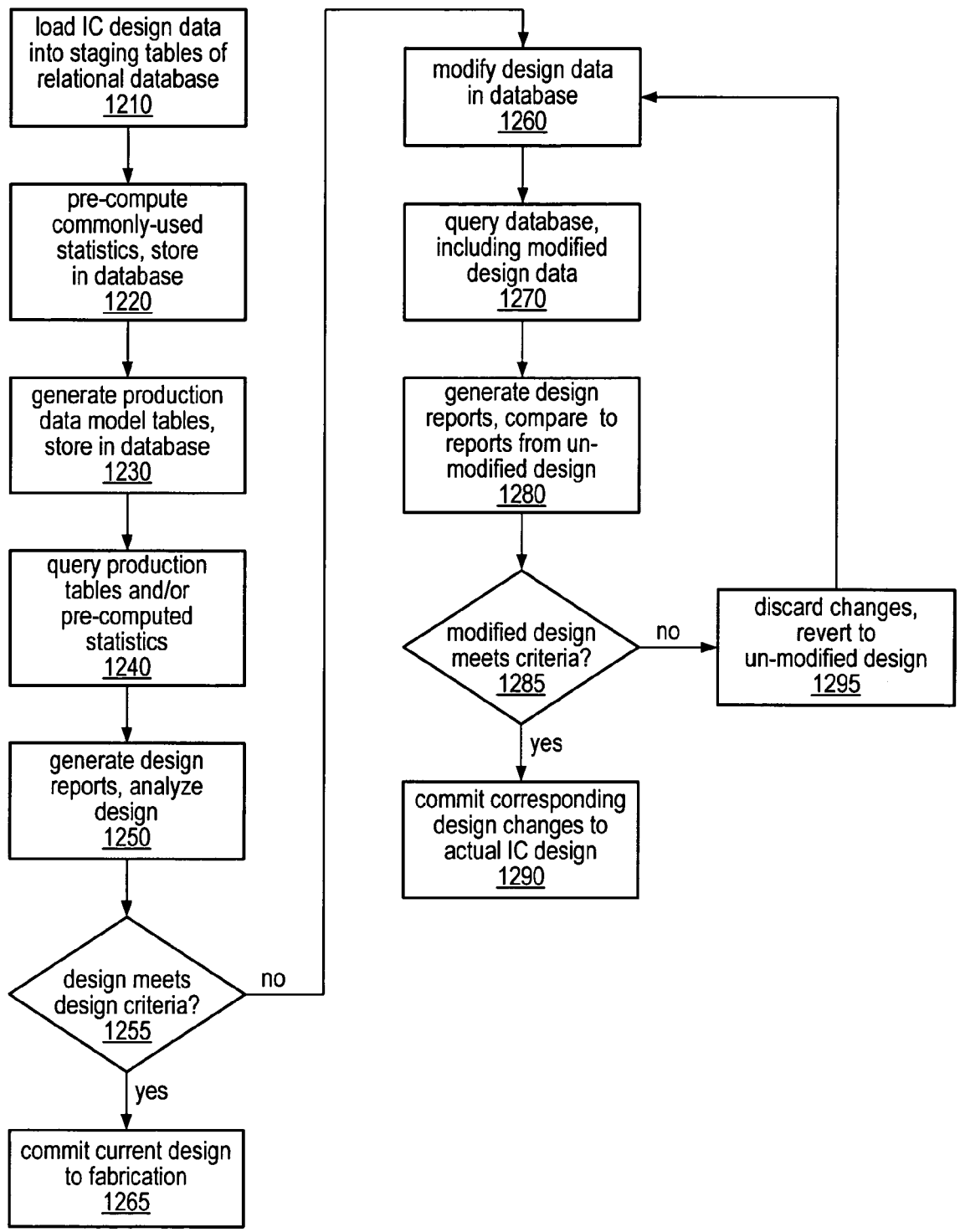
FIG. 12 illustrates a method for modifying design data in a relational database, according to one embodiment.

The design methodology illustrated in FIG. 12 may in some embodiments include more, fewer, or different operations, or may include more, fewer, or different feedback loops, according to various embodiments. As previously noted, an individual application user may have read-only or read-write access to the production databases, according to various embodiments. Therefore, in some embodiments, modifications my be made to a copy of one or more production database tables in step 1260, and proliferated to the corresponding production database tables and/or other copies being used by other application users only after the effect of the modification has been determined. This proliferation may be performed automatically in some embodiments, while in others, the user or database owner may explicitly execute a command to proliferate the design data modifications.

Figure 13:
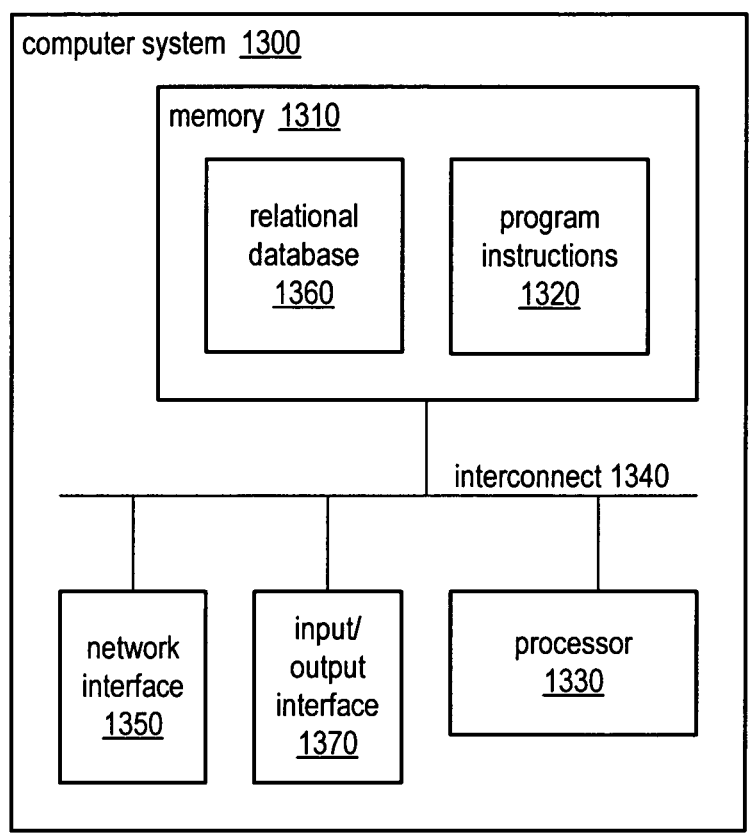
FIG. 13 illustrates a computer system suitable for implementing integrated circuit design using a relational database as the persistent data store, according to one embodiment.

The design and analysis environment and integrated relational database described herein may be implemented on various computer systems, according to different embodiments. For example, FIG. 13 illustrates one computer system suitable for implementing integrated circuit design using a relational database as the persistent data store. Computer system 1300 may be one of any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc, or in general any type of computing device.

In the example illustrated by FIG. 13, computer system 1300 may include one or more processors 1330, interconnect 1340, one or more memories 1310, one or more network interfaces 1350 and one or more input/output interfaces 1370. In other embodiments, computer system 1300 may be partitioned into more or fewer components, or the components illustrated as being part of a single computer system 1300 may be distributed among two or more computer systems or nodes, according various system configurations.

Processor 1330 may be configured to implement any of various instruction set architectures, such as x86, SPARC, PowerPC, etc. In some embodiments, processor 1330 may include a single CPU core, multiple CPU cores, or any combination of one or more general-purpose CPU cores and special-purpose cores (e.g., digital signal processors, hardware accelerators, co-processors, etc.) In various embodiments, processor 1330 may be configured to implement a superscalar architecture or may be configured to implement multi-threading.

In some embodiments, program instructions 1320 may be configured to implement the design and analysis environment described herein, which may be executed by processor 1330. Integrated relational database 1360, as described herein, may also be stored in memory 1310. In other embodiments, program instructions 1320 and/or relational database 1360 may be stored in another type of computer-accessible medium, which may or may not be separate from computer system 1300. Examples of such computer-accessible media include, but are not limited to, installation media, e.g., a CD-ROM or floppy disk, computer system memory such as DRAM, SRAM, EDO RAM, SDRAM, DDR SDRAM, Rambus RAM, flash memory, etc., or non-volatile memory such as a magnetic media, e.g., a hard drive or optical storage. In some embodiments, program instructions 1320 and/or relational database 1360 may be partitioned between memory 1310 and other memory. Program instructions 1320 and relational database 1360 may be implemented using any of various programming languages or methods, according to various embodiments.

Interface 1340 may couple processor 1330 to memory 1310, as illustrated. In some embodiments, interface 1340 may be configured to couple processor 1330 directly to a computer system network. In other embodiments, interface 1340 may be configured to couple processor 1330 to a network interface, such as a network interface 1350. In some embodiments, interface 1340 and input/output interface 1370 may be configured to implement one or more of various interface or network standards, e.g., Peripheral Component Interconnect (PCI), Ethernet, HyperTransport (HT), Infiniband, or any variant or successor of these or other suitable input/output protocols. In some embodiments, interface 1340 or input/output interface 1370 may incorporate some or all of the functionality of network interface 1350.

It should be appreciated that although embodiments described herein include techniques executed by software modules, operations discussed herein may consist of commands entered directly by a computer system user, such as a user of computer system 1300, in some embodiments. The functionality of step referred to herein may correspond to the functionality of modules or portions of modules (e.g., software, firmware, or hardware modules), according to various embodiments. In addition to software modules, the above flows or portions of flows may, in some embodiments, be implemented as application instructions or menu items. For example, a function that performs geometric operations on design data, as described herein, may be an application instruction provided by an EDA tool provider, according to some embodiments. In some embodiments, the software modules described herein may include script, batch or other executable files, or combinations and/or portions of such files. The flows described herein, and the operations thereof may be executed on a computer system configured to execute the operations of the flows and/or may be executed from computer accessible media, according to various embodiments. In some embodiments, the flows may be embodied in a machine-readable and/or computer accessible storage medium for configuring a computer system to execute the flows. In other embodiments, the software modules may be transmitted to a computer system memory to configure the computer system to perform the functions of the module.

The techniques described herein may be applied to an entire integrated circuit design or to portions thereof, according to various embodiments. For example, design data for each functional block or cell may be loaded into a relational database and analyzed as that portion of the design is completed. Similarly, if one portion of the design is being reused from a previous (successfully fabricated) design, the design data for that portion may not be loaded into the relational database for further analysis. In another example, if only one portion of the design fails to meet the desired design criteria, detailed analysis and modifications may only be performed on that portion of the design.

Although the above embodiments have been described in relation to specific EDA tools, database tools, and programming languages, the techniques described herein may be applicable to and make use of any EDA tools and relational databases, and may be implemented in any code language, according to various embodiments. Moreover, although the above embodiments have been described in relation to integrated circuit design, the techniques described herein may be equally useful in the design of other electronic devices, for example in the design of a printed wiring board, in some embodiments.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method, comprising:
performing, by one or more computers:
loading design data into a plurality of tables in a relational database, wherein said design data represents an integrated circuit and was generated by one or more tools of an integrated circuit design flow during design of said integrated circuit, wherein said design data comprises two or more abstractions of said integrated circuit, and wherein data corresponding to said two or more abstractions is related in said relational database;
querying one or more of the plurality of tables in said relational database to access said design data;
generating one or more design reports for said integrated circuit dependent on said accessed design data; and
modifying the design data representing said integrated circuit that was accessed and used in generating the one or more design reports directly in the plurality of tables in the relational database without modifying the actual design of said integrated circuit within the integrated circuit design flow, wherein the modified design data represents a proposed version of said integrated circuit that has not been generated using the one or more tools of the integrated circuit design flow that were used to generate the design data.

2. The method of claim 1, wherein at least one of said two or more abstractions is represented by one of: a layout data model that was generated by parsing or translating an output file of a tool of the integrated circuit design flow to format it for storage in tables in the relational database, a timing data model, a noise data model, a power data model, a clock data model, or a test data model.

3. The method of claim 1, wherein said relational database provides one or more geometric functions configured to apply a geometric operation to said design data, and wherein at least one of said generating one or more design reports and said modifying said design data comprises operating on said accessed design data using one or more of said one or more geometric functions.

4. The method of claim 1, wherein said relational database is configured to allow said querying and said generating to be performed by a plurality of users concurrently.

5. The method of claim 1, further comprising:
generating one or more other design reports dependent on said modified design data; and
determining an effect of said modifying on the proposed version of said integrated circuit represented by said modified design data.

6. The method of claim 5, wherein said determining an effect comprises comparing said one or more other design reports to said one or more design reports to identify differences between them.

7. The method of claim 1, wherein said relational database is configured to allow said modifying to be performed by a plurality of users concurrently and to propagate modifications made by one of said plurality of users to another of said plurality of users.

8. The method of claim 1, wherein said two or more abstractions of said integrated circuit are associated with each other in said relational database by a plurality of net names common to the two or more abstractions.

9. The method of claim 1, wherein said generating one or more design reports comprises analyzing said accessed design data, and in response to said analyzing creating one or more of: a table, a graph, a waveform, a database entry, a stored result, or a document.

10. The method of claim 1, wherein said generating one or more design reports comprises analyzing said accessed design data, and in response to said analyzing displaying one or more results of said analyzing on an input/output device.

11. The method of claim 1, further comprising computing one or more statistics dependent on said accessed design data and storing said one or more computed statistics in said relational database;
wherein said generating one or more design reports comprises:
querying said relational database to access said one or more computed statistics; and
generating said one or more design reports dependent on said accessed statistics.

12. The method of claim 1, wherein said relational database is an Oracle™ database.

13. A computer system, comprising:
a processor;
a memory coupled to said processor, wherein said memory comprises a relational database;
an input/output device coupled to said processor;
wherein said processor is configured to store design data representing an integrated circuit in a plurality of tables in said relational database;
wherein said design data comprises two or more abstractions of said integrated circuit that were generated by one or more tools of an integrated circuit design flow during design of said integrated circuit, and wherein data corresponding to said two or more abstractions is related in said relational database;
wherein said processor is further configured to:
query one or more of the plurality of tables in said relational database to access said design data;
generate one or more design reports for said integrated circuit dependent on said accessed design data; and
modify the design data representing said integrated circuit that was accessed and used in generating the one or more design reports directly in the plurality of tables in the relational database without modifying the actual design of said integrated circuit within the integrated design flow, wherein the modified design data represents a proposed version of said integrated circuit that has not been generated using the one or more tools of the integrated circuit design flow that were used to generate the design data.

14. The computer system of claim 13, wherein at least one of said two or more abstractions is represented by one of: a layout data model that was generated by parsing or translating an output file of a tool of the integrated circuit design flow to format it for storage in tables in the relational database, a timing data model, a noise data model, a power data model, a clock data model, or a test data model.

15. The computer system of claim 13, wherein said relational database provides one or more geometric functions configured to apply a geometric operation to said integrated circuit design data, and wherein at least one of said generating said one or more design reports and said modifying said design data comprises operating on said accessed design data using one or more of said one or more geometric functions.

16. The computer system of claim 13, wherein said processor is further configured to:
    generate one or more other design reports dependent on said modified design data; and
    determine an effect of said modifying on the proposed version of said integrated circuit represented by said modified design data.

17. The computer system of claim 16, wherein said processor is configured to allow a plurality of concurrent accesses to said relational database in order to query said database, generate said one or more design reports, modify said design data, generate said one or more other design reports, and determine an effect of said modifying.

18. A non-transitory computer-readable storage medium storing program instructions computer-executable to implement:
    loading design data representing an integrated circuit into a plurality of tables in a relational database, wherein said design data comprises two or more abstractions of said integrated circuit that were generated by one or more tools of an integrated circuit design flow during design of said integrated circuit;
    querying one or more of the plurality of tables in said relational database to access said design data;
    generating one or more design reports for said integrated circuit dependent on said accessed design data; and
    modifying the design data representing said integrated circuit that was accessed and used in generating the one or more design reports directly in the plurality of tables in the relational database without modifying the actual design of said integrated circuit within the integrated design flow, wherein the modified design data represents a proposed version of said integrated circuit that has not been generated using the one or more tools of the integrated circuit design flow that were used to generate the design data;
    wherein at least one of said two or more abstractions is represented by one of: a layout data model that was generated by parsing or translating an output file of a tool of the integrated circuit design flow to format it for storage in tables in the relational database, a timing data model, a noise data model, a power data model, a clock data model, or a test data model; and
    wherein data corresponding to said two or more abstractions is related in said relational database.

19. The storage medium of claim 18, wherein said program instructions are further executable to implement:
    generating one or more other design reports dependent on said modified design data; and
    determining an effect of said modifying on the proposed version of said integrated circuit represented by said modified design data.

20. The storage medium of claim 18, wherein said relational database provides one or more geometric functions configured to apply a geometric operation to said design data, and wherein at least one of said generating one or more design reports and said modifying said design data comprises operating on said accessed design data using one or more of said one or more geometric functions.

* * * * *